United States Patent
Igeta et al.

(10) Patent No.: US 8,946,857 B2
(45) Date of Patent: Feb. 3, 2015

(54) SEMICONDUCTOR DEVICE FOR EFFECTIVELY DISPERSE HEAT GENERATED FROM HEAT GENERATING DEVICE

(75) Inventors: Mitsuaki Igeta, Yokohama (JP); Takashi Suzuki, Kawasaki (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 76 days.

(21) Appl. No.: 13/303,313

(22) Filed: Nov. 23, 2011

(65) Prior Publication Data
US 2012/0068308 A1 Mar. 22, 2012

Related U.S. Application Data

(63) Continuation of application No. PCT/JP2009/061866, filed on Jun. 29, 2009.

(51) Int. Cl.
H01L 29/00 (2006.01)
H01L 23/367 (2006.01)
H01L 23/522 (2006.01)

(52) U.S. Cl.
CPC ........ H01L 23/3677 (2013.01); H01L 23/5228 (2013.01); *H01L 23/5226* (2013.01)
USPC ............ 257/536; 257/E29.166; 257/E21.004; 438/382

(58) Field of Classification Search
CPC .................................. H01L 21/02; H01L 29/66
USPC ............ 257/536, E29.166, E21.004; 438/382
See application file for complete search history.

(56) References Cited

U.S. PATENT DOCUMENTS

| | | | | |
|---|---|---|---|---|
| 5,200,809 A * | 4/1993 | Kwon | ............................ | 257/707 |
| 6,204,533 B1 | 3/2001 | Williams et al. | | |
| 6,320,241 B1 * | 11/2001 | Okamoto | ....................... | 257/528 |
| 6,642,604 B2 * | 11/2003 | Yamaguchi | .................... | 257/536 |
| 6,800,886 B2 * | 10/2004 | Awano | ............................ | 257/276 |
| 7,009,277 B2 * | 3/2006 | Yamaguchi | .................... | 257/536 |
| 7,345,364 B2 * | 3/2008 | Kerr et al. | ....................... | 257/707 |
| 7,394,145 B2 * | 7/2008 | Chinthakindi et al. | ........ | 257/528 |
| 7,550,819 B2 * | 6/2009 | Yamashita | ..................... | 257/536 |
| 7,871,890 B2 * | 1/2011 | Ha et al. | ......................... | 438/385 |

(Continued)

FOREIGN PATENT DOCUMENTS

| | | | |
|---|---|---|---|
| JP | 54-040583 A | 3/1979 | |
| JP | 55-059754 A | 5/1980 | |

(Continued)

OTHER PUBLICATIONS

International Search Report of PCT/JP2009/061866, mailing date Jul. 28, 2009.
Japanese Office Action dated May 7, 2013, issued in corresponding Japanese Patent Application No. 2011-520687, w/ English translation.
German Office Action dated Oct. 7, 2013, issued in corresponding German Patent Application No. 112009005017343, w/ English translation.

*Primary Examiner* — Caleb Henry
(74) *Attorney, Agent, or Firm* — Westerman, Hattori, Daniels & Adrian, LLP

(57) ABSTRACT

A semiconductor device includes a semiconductor substrate, a heat generating device, and a heat radiating part. The heat generating device is provided on the semiconductor substrate, and the heat radiating part is provided above the heat generating device. The heat radiating part is thermally coupled with the semiconductor substrate through at least one contact part.

9 Claims, 12 Drawing Sheets

(56) References Cited

U.S. PATENT DOCUMENTS

| | | | |
|---|---|---|---|
| 7,898,032 B2* | 3/2011 | Suzuki et al. | 257/350 |
| 8,119,491 B2* | 2/2012 | Chinthakindi et al. | 438/381 |
| 8,368,145 B2* | 2/2013 | Fukuoka et al. | 257/355 |
| 2002/0105079 A1* | 8/2002 | Yamaguchi | 257/748 |
| 2003/0052386 A1* | 3/2003 | Yamaguchi | 257/536 |
| 2004/0104452 A1* | 6/2004 | Yamaguchi | 257/536 |
| 2006/0145296 A1* | 7/2006 | Coolbaugh et al. | 257/536 |
| 2008/0048294 A1* | 2/2008 | Yamamoto | 257/536 |
| 2008/0102584 A1* | 5/2008 | Kerr et al. | 438/275 |
| 2009/0001348 A1* | 1/2009 | Kaeriyama et al. | 257/4 |
| 2009/0001517 A1* | 1/2009 | Swanson et al. | 257/539 |
| 2009/0101994 A1* | 4/2009 | Moon | 257/412 |
| 2009/0278189 A1* | 11/2009 | Cho et al. | 257/316 |

FOREIGN PATENT DOCUMENTS

| | | |
|---|---|---|
| JP | 62-040757 A | 2/1987 |
| JP | 63-090846 A | 4/1988 |
| JP | 1-214048 A | 8/1989 |
| JP | 8-046138 A | 2/1996 |
| JP | 2000-031484 A | 1/2000 |
| JP | 2002-231721 A | 8/2002 |

* cited by examiner (a)

(b)

(a)

(b)

(a)

(b)

(a)

(b)

(a)

(b)

(c)

(a)

(b)

(c)

(a)

(b)

(c)

(a)

(b)

(c)

SEMICONDUCTOR DEVICE FOR EFFECTIVELY DISPERSE HEAT GENERATED FROM HEAT GENERATING DEVICE

CROSS-REFERENCE TO RELATED APPLICATION

This application is a continuation application and is based upon PCT/JP2009/061866, filed on Jun. 29, 2009, the entire contents of which are incorporated herein by reference.

FIELD

The embodiments discussed herein are related to a semiconductor device and a semiconductor device production method.

BACKGROUND

In the past, in a semiconductor device (LSI: semiconductor integrated circuit), a resistance device is made using, for example, polycrystalline silicon ("poly-silicon") formed on a silicon substrate.

Such a poly-silicon resistance device (poly-silicon resistor) includes the advantages of having a higher sheet resistance than a resistance device using copper (Cu) or aluminum (Al) and of having a smaller fluctuation in resistance than a resistance device using a diffusion layer of a silicon (Si) substrate.

However, since a poly-silicon resistor includes a high sheet resistance, it generates a large Joule's heat per current and, for example, is liable to cause a drop in the reliability of a Cu interconnect which is provided near the poly-silicon resistor.

In this regard, in the past, various proposals are made for semiconductor devices which are designed to disperse heat from resistance devices to thereby suppress a rise in temperature in the surroundings.

Patent Document 1: Japanese Laid-open Patent Publication No. S63-090846

Patent Document 2: Japanese Laid-open Patent

Patent Document 3: Japanese Laid-open Patent Publication No. S62-040757

Patent Document 4: Japanese Laid-open Patent Publication No. 2000-031484

SUMMARY

According to an aspect of the embodiments, a semiconductor device includes a semiconductor substrate; a heat generating device provided on the semiconductor substrate; and a heat radiating part provided above the heat generating device. Wherein, the heat radiating part is thermally coupled with the semiconductor substrate through at least one contact part.

The object and advantages of the embodiments will be realized and attained by the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

First, before explaining embodiments of a semiconductor device and a semiconductor device production method in detail, the resistance device part in a semiconductor device and the issues involved in the same will be explained with reference to FIG. 1, FIG. 2, and FIG. 3.

Figure 1:
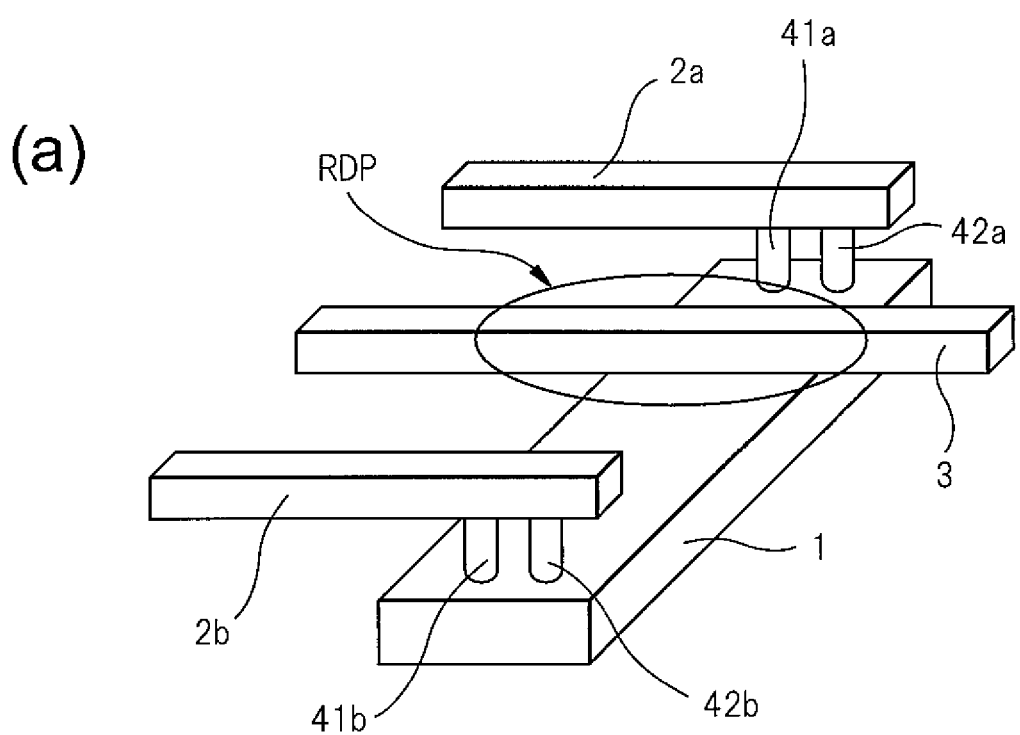
FIG. 1 gives a view which illustrates one example of a resistance device part in a semiconductor device.
Figure 1:
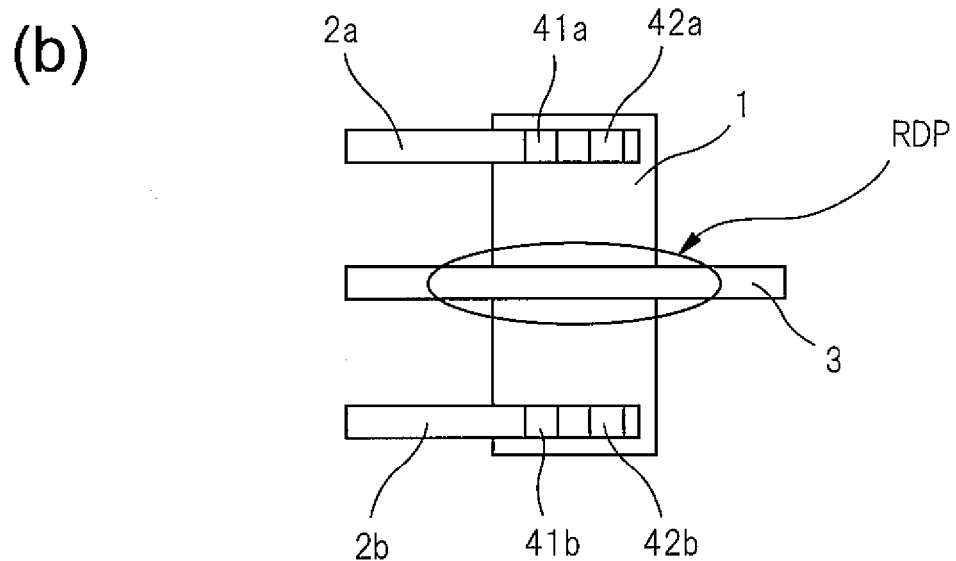

FIG. 1 is a view which illustrates one example of a resistance device part in a semiconductor device, wherein FIG. 1(a) gives a perspective view and FIG. 1(b) gives a plan view.

As illustrated in FIG. 1(a) and FIG. 1(b), the resistance device part includes a resistance device (poly-silicon resistor) 1, resistor-use interconnects 2a and 2b for running current through the poly-silicon resistor 1, and an interconnect (for example, Cu interconnect) 3 which is provided above the poly-silicon resistor 1.

Here, the resistor-use interconnects 2a and 2b are respectively coupled to two ends of the poly-silicon resistor 1 by two contact parts 41a, 42a and 41b, 42b and, for example, run current from the interconnect 2a toward the interconnect 2b through the poly-silicon resistor 1.

Note that, between the poly-silicon resistor 1 and the resistor-use interconnects 2a and 2b and Cu interconnect 3, an insulating layer is formed. Further, the resistor-use interconnects 2a and 2b and interconnect 3 are, for example, formed from the first layer Cu.

As explained above, in the semiconductor device which is illustrated in FIG. 1, if current flows to the poly-silicon resistor 1, Joule's heat is generated. Due to the heat from the poly-silicon resistor 1, for example, the temperature of the reliability danger part RDP of the Cu interconnect 3 which is provided above the poly-silicon resistor 1 rises.

Here, since the poly-silicon resistor 1 includes a high sheet resistance, it generates a large Joule's heat per current and causes a drop in of the reliability of the Cu interconnect 3 nearby (for example, provided above it). Note that, the poly-silicon of the poly-silicon resistor 1 includes a sufficiently high reliability compared with the Cu of the Cu interconnect 3.

For this reason, the allowable value of the amount of current of the poly-silicon resistor 1 is defined taking into consideration the drop in reliability of the nearby Cu interconnect 3 due to the Joule's heat which is generated from the poly-silicon resistor 1.

That is, the allowable value of the amount of current of the poly-silicon resistor 1 is defined so that the temperature of the reliability danger part RDP at the Cu interconnect 3 which is positioned above the poly-silicon resistor 1 becomes a given temperature (for example, 130° C.) or less.

Figure 2:
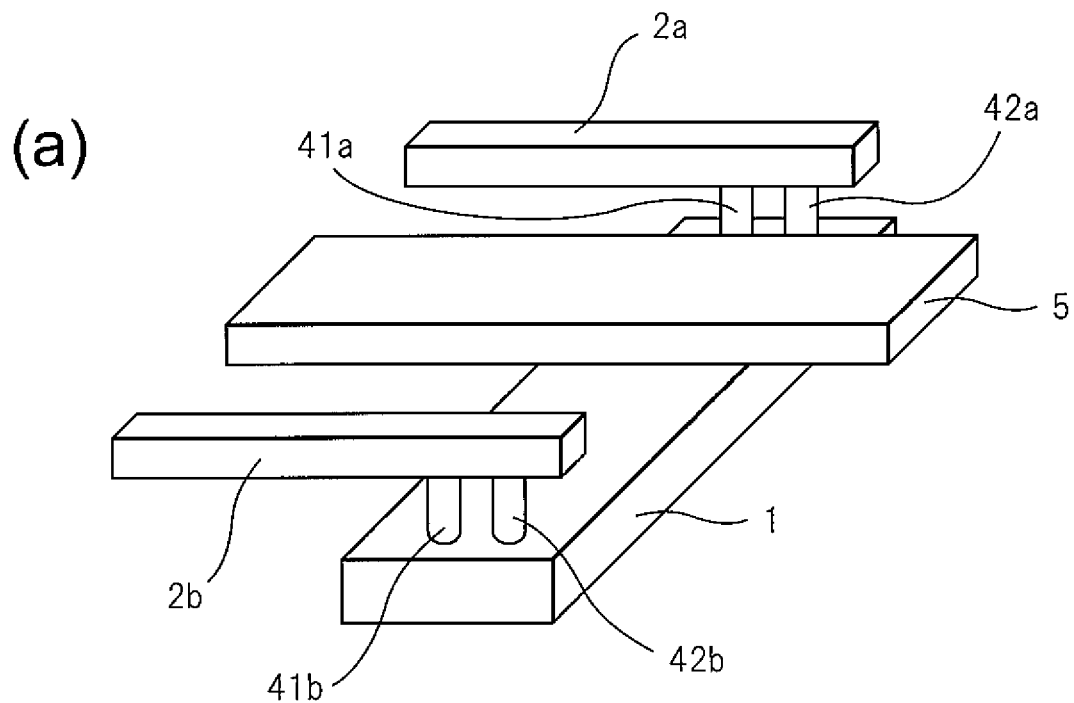
FIG. 2 gives a view which illustrates another example of a resistance device part in a semiconductor device.
Figure 2:
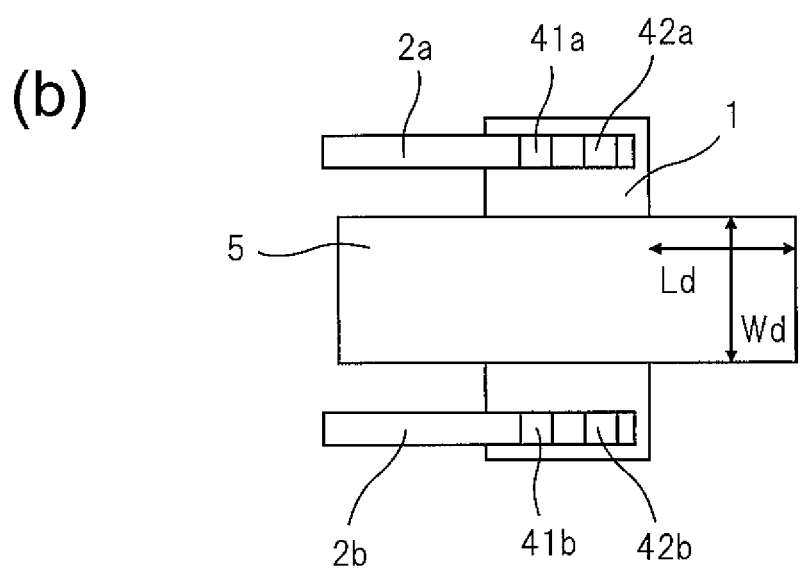

FIG. 2 gives a view which illustrates another example of a resistance device part in a semiconductor device, wherein FIG. 2(*a*) gives a perspective view and FIG. 2(*b*) gives a plan view.

The resistance device part of the semiconductor device which is illustrated in FIG. 2(*a*) and FIG. 2(*b*) is provided with a heat radiating part 5 comprised of, for example, a metal, above the poly-silicon resistor (resistance device) 1.

Here, while omitted in FIG. 2(*a*) and FIG. 2(*b*), an interconnect 3 is provided above the heat radiating part 5. Further, the other parts are similar to those explained with reference to FIG. 1(*a*) and FIG. 1(*b*).

That is, the resistor-use interconnects 2*a* and 2*b* and heat radiating part 5 are, for example, formed from the first layer Cu, while the interconnect 3 is, for example, formed by a second layer Cu above the first layer Cu.

Note that, between the poly-silicon resistor 1 and the resistor-use interconnects 2*a* and 2*b* and heat radiating part 5 and between the heat radiating part 5 and the Cu interconnect 3, insulating layers are formed needless to say.

In the semiconductor device which is illustrated in FIG. 2, a metal heat radiating part 5 is provided above the poly-silicon resistor 1, and that heat radiating part 5 is used to disperse heat from the poly-silicon resistor 1 so as to suppress a rise in temperature of the Cu interconnect 3 (not illustrated) which is provided above the heat radiating part 5. That is, a temperature rise of the reliability danger part RDP of the Cu interconnect 3 at the semiconductor device which is illustrated at FIG. 1 is suppressed.

Figure 3:
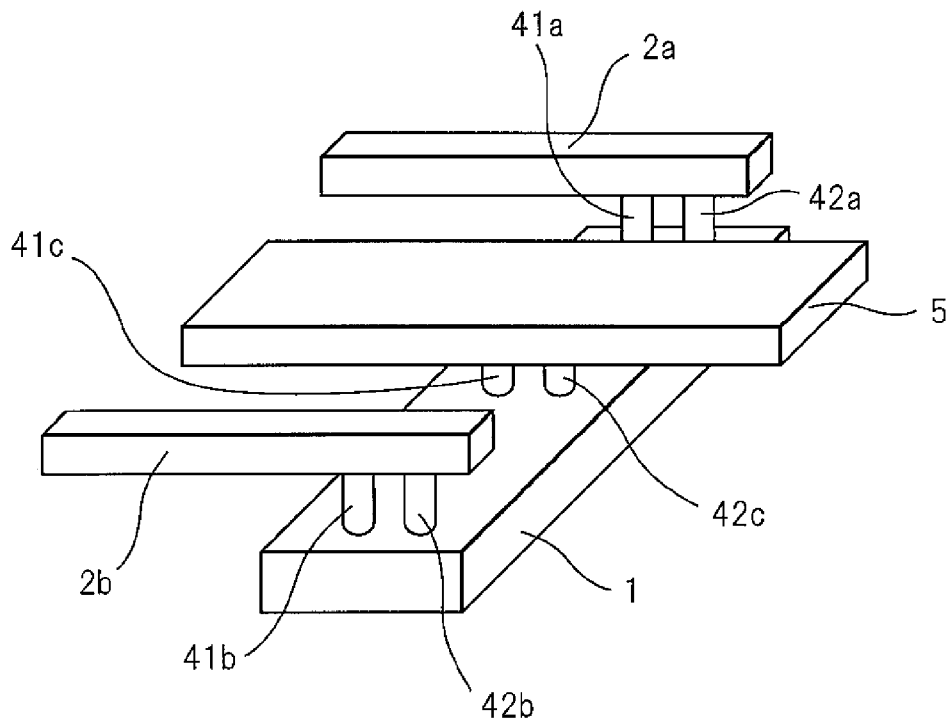
FIG. 3 gives a view which illustrates still another example of a resistance device part in a semiconductor device.
Figure 3:
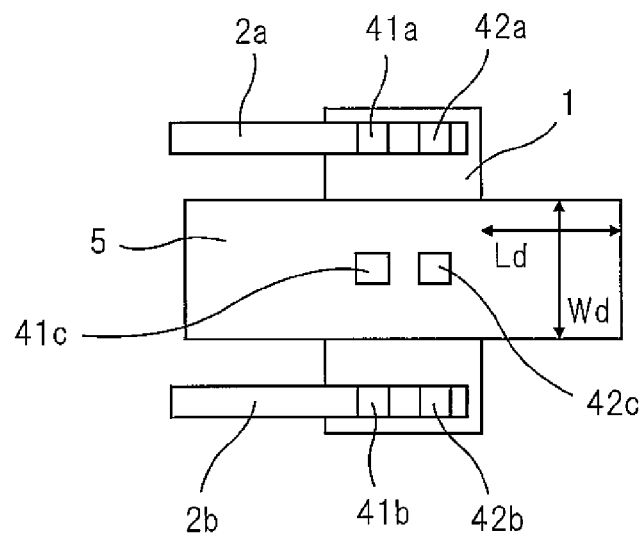

FIG. 3 gives a view which illustrates still another example of a resistance device part in a semiconductor device, wherein FIG. 3(*a*) gives a perspective view and FIG. 3(*b*) gives a plan view.

As clear from a comparison of FIG. 3(*a*) and FIG. 3(*b*) and of FIG. 2(*a*) and FIG. 2(*b*), in the semiconductor device which is illustrated in FIG. 3, the heat radiating part 5 and the poly-silicon resistor 1 are coupled by two contact parts 41*c* and 42*c*.

That is, the contact parts 41*c* and 42*c* are used to convey the heat from the poly-silicon resistor 1 to the heat radiating part 5 and increase the amount of heat which is dispersed from the heat radiating part 5.

Here, in the semiconductor devices of FIG. 2 and FIG. 3, the amount of heat which is dispersed by the heat radiating part 5 increases if increasing the length Ld and the width Wd of the heat radiating part 5 needless to say.

In this way, the heat from the poly-silicon resistor 1 is dispersed through the metal heat radiating part 5 to the surroundings, and a rise in temperature of the reliability danger part RDP (not illustrated) of the Cu interconnect 3 which is provided above the heat radiating part 5 is suppressed.

However, in the semiconductor devices of FIG. 2 and FIG. 3, the heat from the heat radiating part 5 is dispersed along the insulating layer at the surroundings, but, for example, an oxide film ($SiO_2$) or nitride film ($Si_3N_4$) insulating layer is low in heat conduction rate (heat dispersion rate). The rise in temperature of the Cu interconnect 3 may not be said to be sufficiently suppressed.

In this regard, to suppress the temperature rise of the Cu interconnect 3 (reliability danger part RDP), for example, it is possible to restrict the current which is run through the poly-silicon resistor 1, increase the thickness of the insulating layer between the heat radiating part 5 (poly-silicon resistor 1) and Cu interconnect 3, or increase the area of the heat radiating part 5.

However, the above such approaches run counter to the recent demands for smaller size and higher precision of semiconductor devices and further lead to a reduction in the freedom of circuit design.

Below, examples of a semiconductor device and a semiconductor device production method will be explained with reference to the attached figures.

Figure 4:
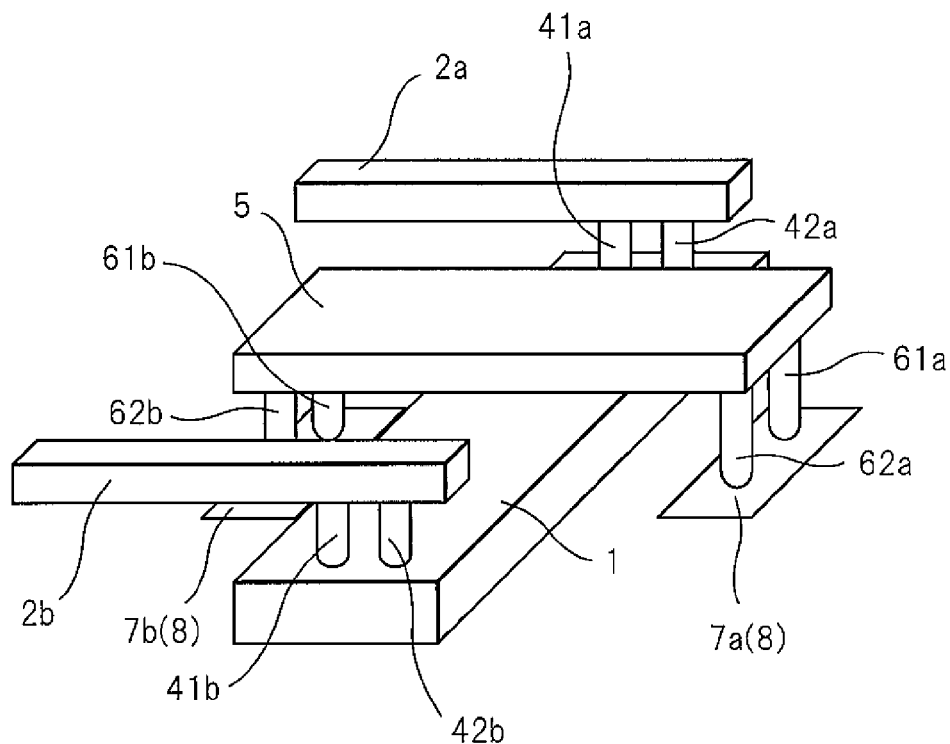
FIG. 4 gives a view which illustrates a resistance device part in a semiconductor device of a first embodiment.
Figure 4:
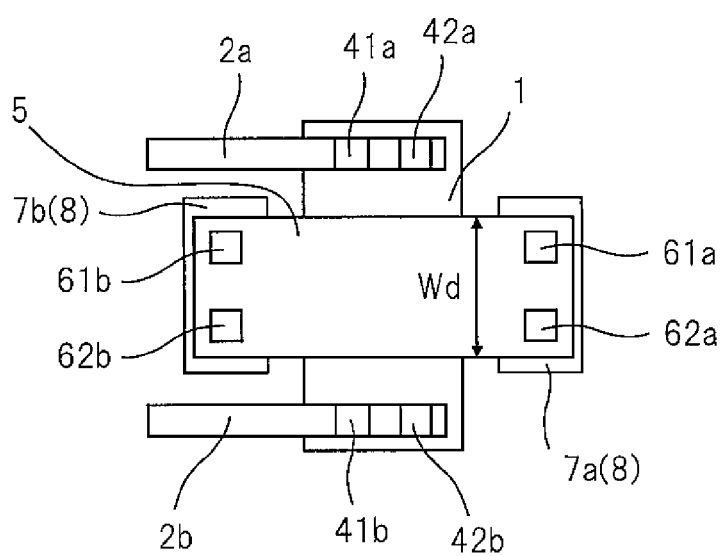

FIG. 4 gives a view which illustrates a resistance device part in a semiconductor device of a first embodiment, wherein FIG. 4(*a*) gives a perspective view and FIG. 4(*b*) gives a plan view.

As illustrated in FIG. 4(*a*) and FIG. 4(*b*), a resistance device part of a semiconductor device of the first embodiment includes a resistance device (poly-silicon resistor) 1 and resistor-use interconnects 2*a* and 2*b* which run current through the poly-silicon resistor 1.

Furthermore, the resistance device part of the semiconductor device of the first embodiment includes a heat radiating part 5 which is provided above the poly-silicon resistor 1 and an interconnect (for example, Cu interconnect) 3 which is provided above the heat radiating part 5.

That is, the resistor-use interconnects 2*a* and 2*b* and heat radiating part 5 are, for example, formed by the first layer Cu, while the interconnect 3 is, for example, formed by a second layer Cu above the first layer Cu.

Note that, the heat radiating part 5 is not limited to one formed by the same interconnect layer as the resistor-use interconnects 2*a* and 2*b*. Further, the material may be, in addition to Cu, tungsten (W) or another metal or carbon nanotubes and other substances with large heat dispersion rates.

Here, the resistor-use interconnects 2*a* and 2*b* are coupled respectively by the two contact parts 41*a*, 42*a* and 41*b*, 42*b* to the two ends of the poly-silicon resistor 1 and, for example, run current from the interconnect 2*a* toward the interconnect 2*b* through the poly-silicon resistor 1.

Note that, between the poly-silicon resistor 1 and the resistor-use interconnects 2*a* and 2*b* and heat radiating part 5, an insulating layer (first insulating layer 11) is formed. Further, between the heat radiating part 5 (resistor-use interconnects 2*a* and 2*b*) and Cu interconnect 3 (not illustrated), an insulating layer (second insulating layer 12) is formed.

The two ends of the heat radiating part 5 are coupled by two respective contact parts 61*a*, 62*a* and 61*b*, 62*b* to the active regions 7*a* and 7*b* of the substrate (semiconductor substrate: silicon substrate 8).

Due to this, the heat from the poly-silicon resistor 1 is received at the heat radiating part 5, while the heat of the heat radiating part 5 is dispersed through the contact parts 61*a*, 62*a* and 61*b*, 62*b* to the substrate 8.

That is, in the semiconductor device of the first embodiment, it is possible to release the heat of the heat radiating part 5 through the contact parts 61*a*, 62*a*; 61*b*, 62*b* at the substrate 8 to thereby effectively disperse the heat which is generated from the poly-silicon resistor 1 and suppress a rise in temperature of the Cu interconnect 3 which is provided nearby.

This indicates that it is possible to raise the upper limit value of the allowable amount of current of the poly-silicon resistor 1 or reduce the size of the poly-silicon resistor 1. Furthermore, it enables improvement of the circuit integration degree of the semiconductor device. Note that, this effect is similarly exhibited in the following embodiments as well.

Note that, the resistance device 1 is not limited to a poly-silicon resistor. Further, it may be a heat generating device which generates heat other than a resistance device.

Figure 5:
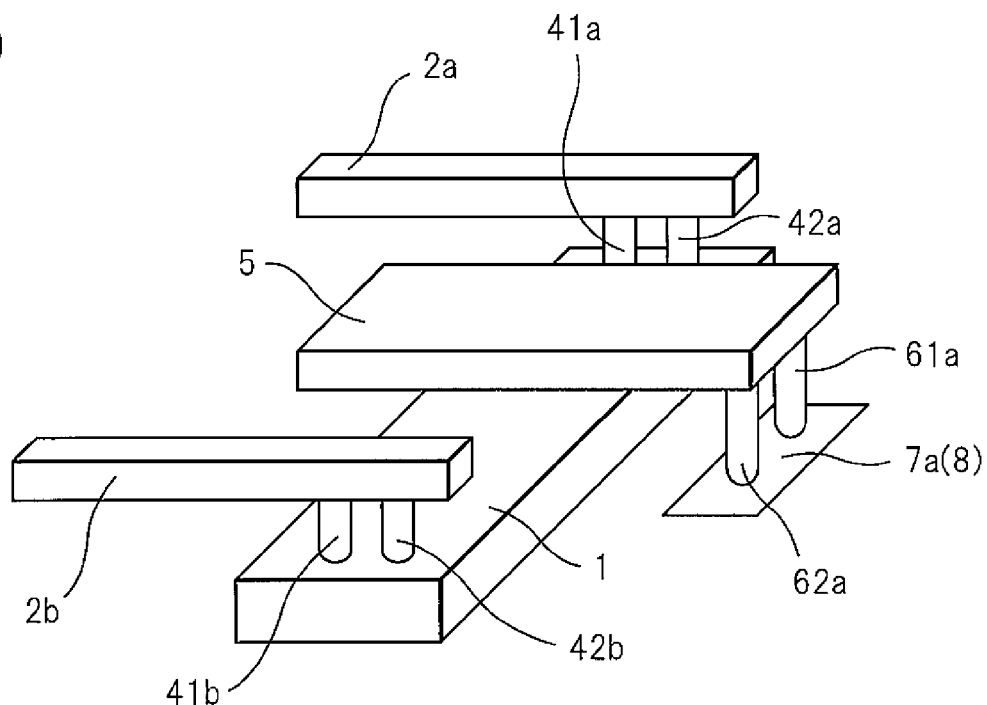
FIG. 5 gives a view which illustrates a resistance device part in a semiconductor device of a second embodiment.
Figure 5:
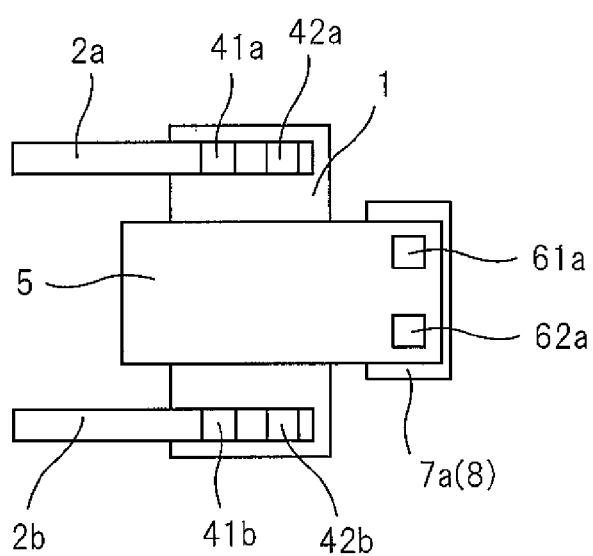

FIG. 5 gives a view which illustrates a resistance device part in a semiconductor device of a second embodiment, wherein FIG. 5(*a*) gives a perspective view and FIG. 5(*b*) gives a plan view.

As clear from a comparison of FIG. 5(*a*) and FIG. 5(*b*) and FIG. 4(*a*) and FIG. 4(*b*), the resistance device part of the semiconductor device of the second embodiment includes one end of the heat radiating part 5 coupled by two contact parts 61*a* and 62*a* to the active region 7*a* of the substrate 8.

In this way, the heat radiating part 5 and the substrate 8 (active region 7*a*) may be coupled at one end or both ends of the heat radiating part 5. Note that, the connections between the heat radiating part 5 and the substrate 8 are not limited to two (contact parts 61*a* and 62*a*) at one end of the heat radiating part 5 needless to say.

Figure 6:
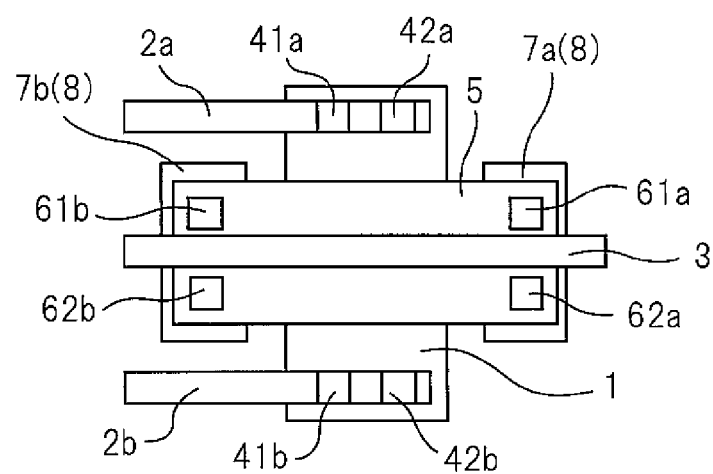
FIG. 6 gives a view for explaining an example of a resistance device part including an upper interconnect.
Figure 6:
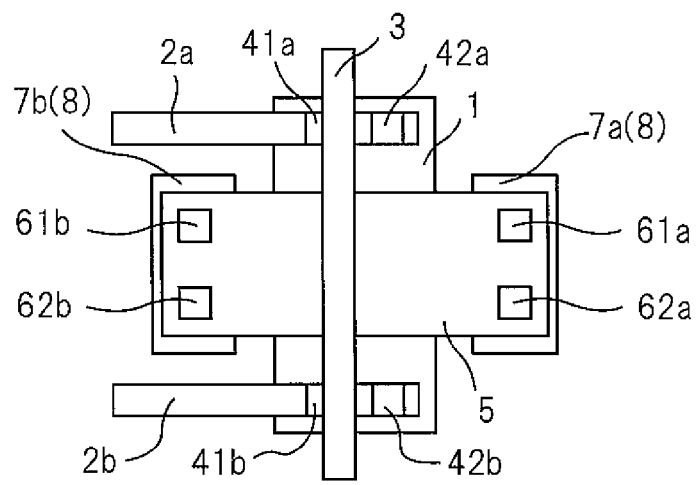
Figure 6:
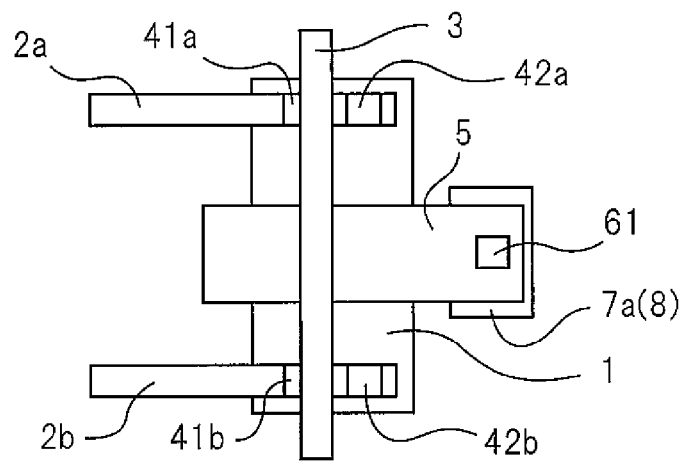

FIG. 6 gives a view for explaining an example of a resistance device part which includes an upper interconnect, wherein FIG. 6(*a*) and FIG. 6(*b*) illustrate the first embodiment of FIG. 4, while FIG. 6(*c*) illustrates the second embodiment of FIG. 5. Note that, in FIG. 6(*c*), there is just a single contact part 61 which couples the heat radiating part 5 and the substrate 8.

That is, the Cu interconnect 3, for example, as illustrated in FIG. 6(*a*), is formed by the second layer Cu in a direction parallel to the resistor-use interconnects 2*a* and 2*b* which are formed by the first layer Cu. Alternatively, as illustrated in FIG. 6(*b*), it is formed by the second layer Cu in a direction perpendicular to the resistor-use interconnects 2*a* and 2*b*.

Note that, FIG. 6(*c*) illustrates a second embodiment in which there is just a single contact part 61 which couples the heat radiating part 5 and the substrate 8, but the Cu interconnect 3 may also be oriented to be parallel to the resistor-use interconnects 2*a* and 2*b* as illustrated in FIG. 6(*a*).

Here, between the heat radiating part 5 (resistor-use interconnects 2*a* and 2*b*) and Cu interconnect 3, an insulating layer (second insulating layer 12) is formed.

Figure 7:
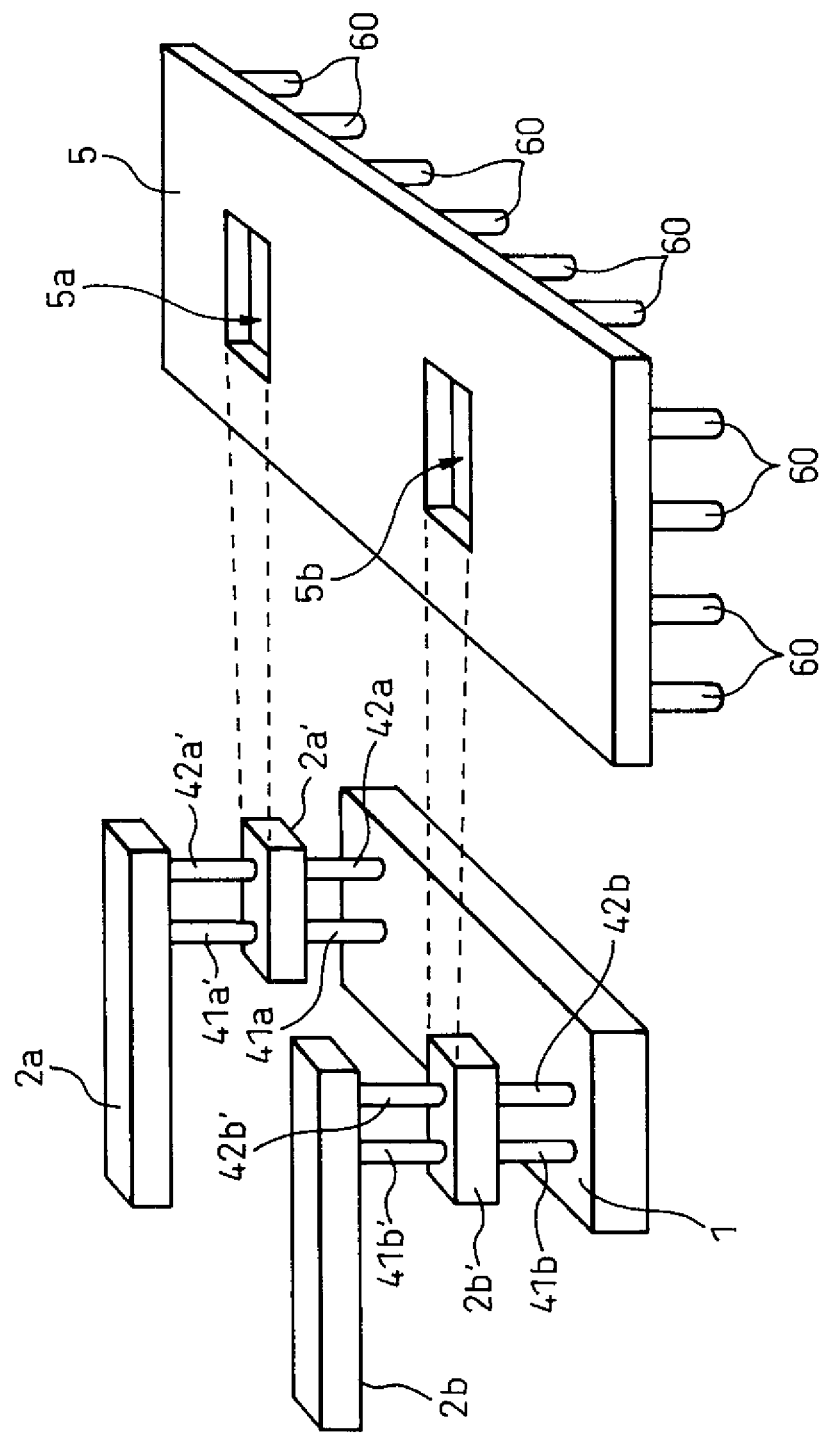
FIG. 7 is a view which illustrates a resistance device part in a semiconductor device of a third embodiment (part 1)
Figure 8:
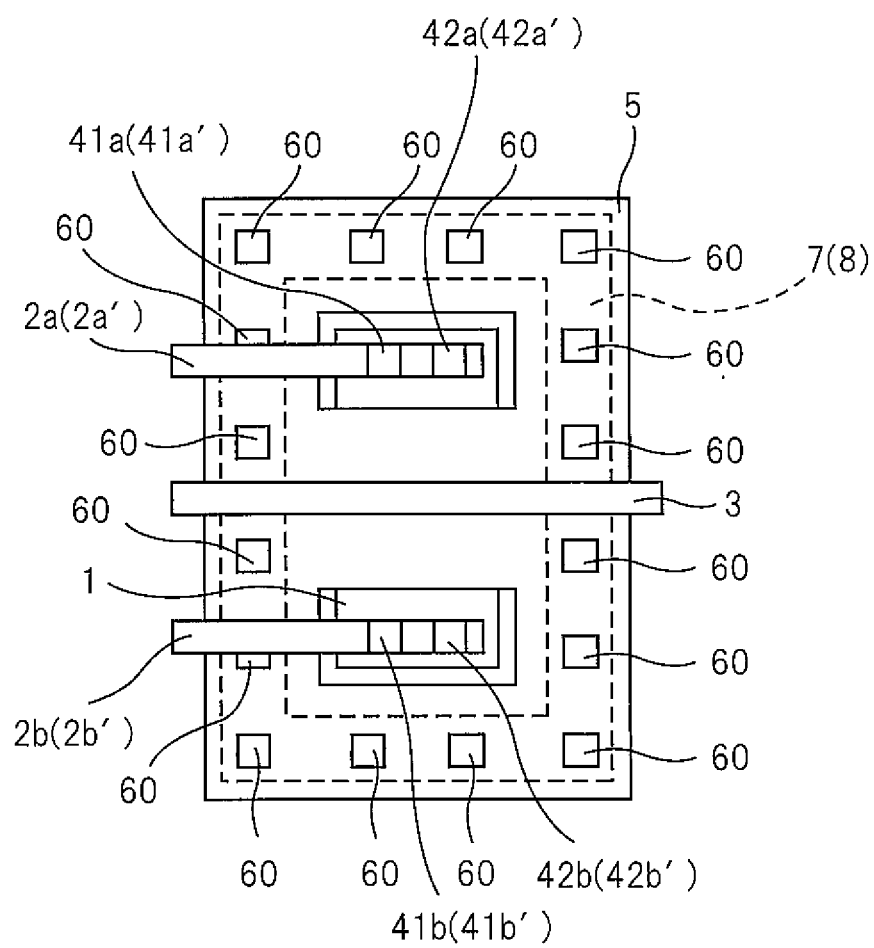
FIG. 8 is a view which illustrates a resistance device part in a semiconductor device of a third embodiment (part 2)

FIG. 7 and FIG. 8 give views which illustrate a resistance device part in a semiconductor device of a third embodiment, wherein FIG. 7 gives a disassembled perspective view and FIG. 8 gives a plan view.

As illustrated in FIG. 7 and FIG. 8, a resistance device part in a semiconductor device of a third embodiment is provided with an active region 7 which is formed in a well so as to surround the poly-silicon resistor 1. A heat radiating part 5 is provided on the poly-silicon resistor 1 so as to cover the active region 7.

The heat radiating part 5 is formed with aperture holes 5*a* and 5*b*. Inside of these aperture holes 5*a* and 5*b*, the resistor-use interconnects 2*a*' and 2*b*' are positioned.

Specifically, as illustrated in FIG. 7, for example, the heat radiating part 5 and the resistor-use interconnects 2*a*' and 2*b*' are formed by the first layer Cu, while the resistor-use interconnects 2*a* and 2*b* are formed by the second layer Cu.

Note that, as illustrated in FIG. 8, the Cu interconnect 3 is, for example, formed by a third layer Cu. Further, between the aperture holes 5*a* and 5*b* of the heat radiating part 5 and the resistor-use interconnects 2*a*' and 2*b*', an insulating film is provided.

That is, the resistor-use interconnect 2*a* is electrically coupled through the contact parts 41*a*' and 42*a*' to the resistor-use interconnect 2*a*', while the resistor-use interconnect 2*a*' is electrically coupled through the contact parts 41*a* and 42*a* to one end of the poly-silicon resistor 1.

Similarly, the resistor-use interconnect 2*b* is electrically coupled through the contact parts 41*b*' and 42*b*' to the resistor-use interconnect 2*b*', while the resistor-use interconnect 2*b*' is electrically coupled through the contact parts 41*b* and 42*b* to the other end of the poly-silicon resistor 1.

Note that, the heat radiating part 5 and the active region 7 (substrate 8) are thermally coupled by a plurality of contact parts 60 which are provided at given intervals. Heat from the poly-silicon resistor 1 is received by the heat radiating part 5. The heat from the heat radiating part 5 is diffused through the plurality of contact parts 60 to the substrate 8.

By providing the heat radiating part 5 so as to cover the entire surface of the poly-silicon resistor 1 and diffusing the heat from the heat radiating part 5 through a plurality of contact parts 60 to the substrate 8, for example, it is possible to greatly suppress the rise in temperature of the Cu interconnect 3 which is provided above the heat radiating part 5.

Figure 9:
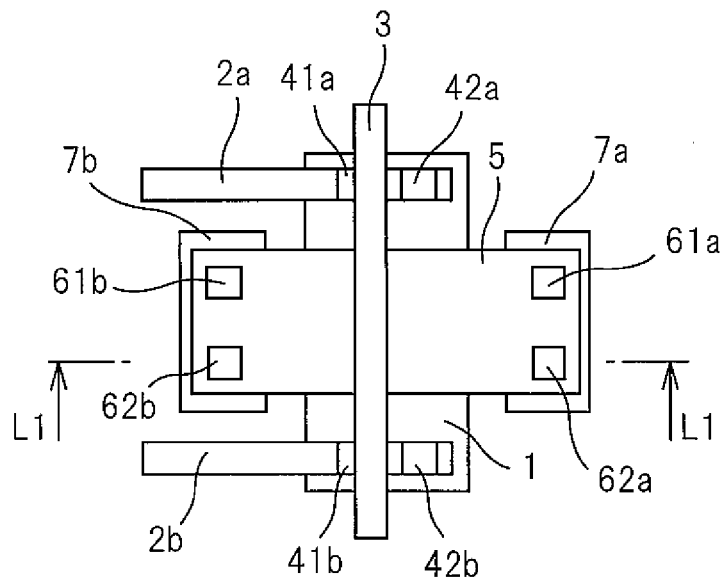
FIG. 9 gives a view for explaining an embodiment of a method of production of a semiconductor device (part 1)
Figure 9:
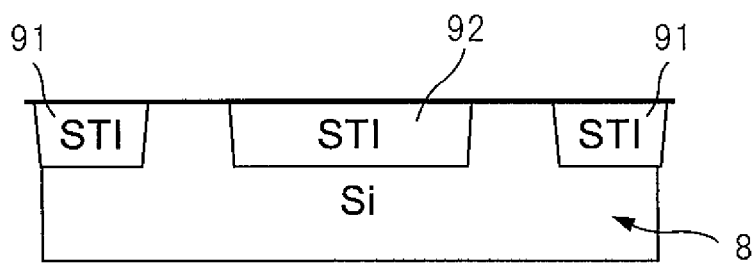
Figure 9:
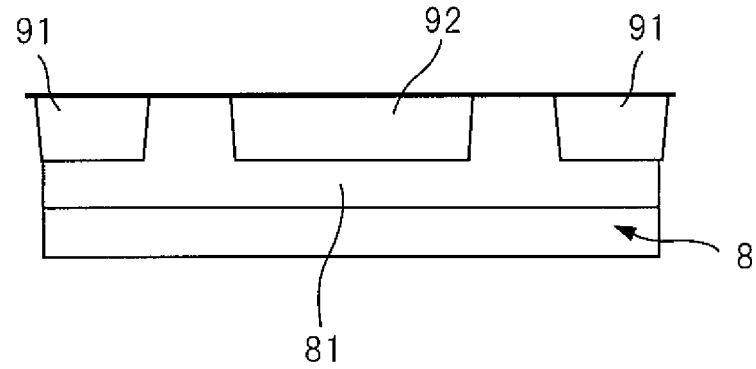
Figure 10:
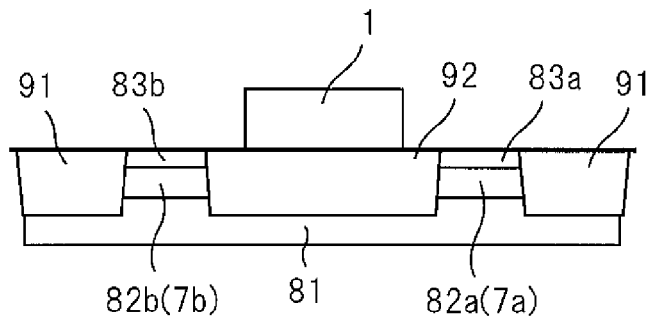
FIG. 10 gives a view for explaining an embodiment of a method of production of a semiconductor device (part 2)
Figure 10:
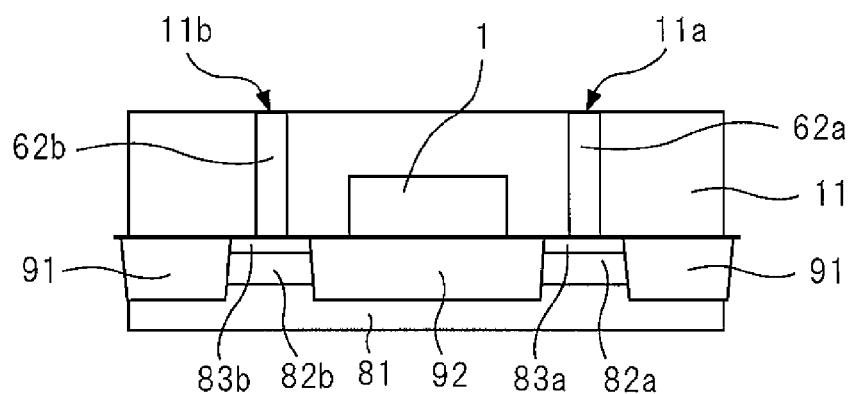
Figure 10:
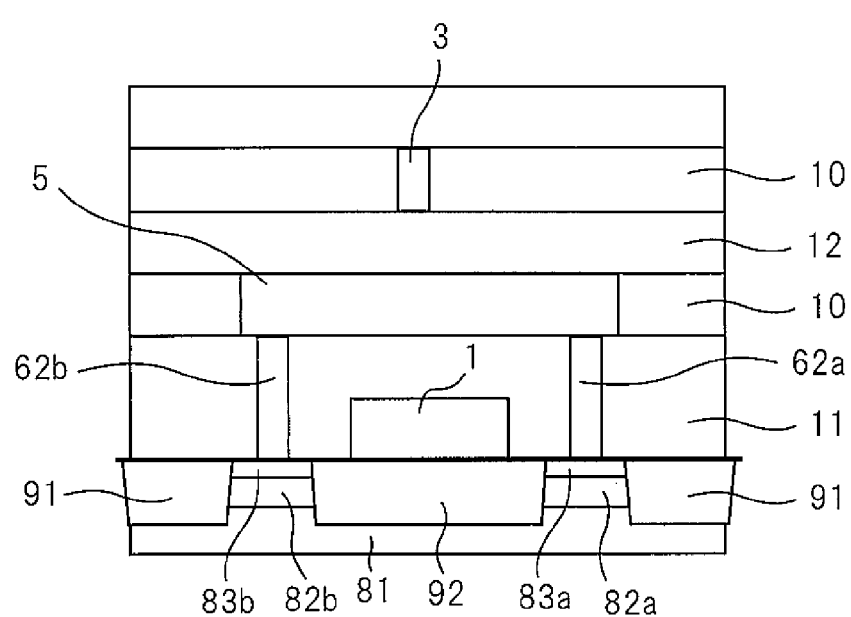

FIG. 9 and FIG. 10 give views for explaining an embodiment of the method of production of a semiconductor device and are views for explaining the steps in the production of a semiconductor device of the first embodiment which was explained with reference to FIG. 4.

Here, as illustrated in FIG. 9(*a*), the FIG. 9(*b*), FIG. 9(*c*), FIG. 10(*a*), FIG. 10(*b*), and FIG. 10(*c*) given below illustrate cross-sections taken along the line L1-L1 of FIG. 9(*a*).

First, as illustrated in FIG. 9(*b*), insulators (STI: shallow trench isolation) 91 and 92 are formed on the silicon substrate (substrate) 8. Here, the STI 91 is for securing the well region on the silicon substrate 8. Further, the STI 92 is for forming a poly-silicon resistor 1 which is insulated from the wells.

Next, as illustrated in FIG. 9(*c*), an impurity is implanted into the silicon substrate 8 surrounded by the STI 91 so as to form a well 81. Note that, the well 81 is made a p-well or an n-well depending on the impurity which is implanted. Further, the well 81, for example, may be formed simultaneously with the wells used in transistors etc.

Furthermore, as illustrated in FIG. 10(*a*), on the STI 92 at the well 81, a poly-silicon resistor 1 is formed. Furthermore, an impurity is implanted to form the active regions 82*a* and 82*b* (7*a* and 7*b*).

Note that, in FIG. 10(*a*), silicide parts 83*a* and 83*b* are formed at the surfaces of the active regions 82*a* and 82*b*, but the silicide parts 83*a* and 83*b* need not be formed.

Next, as illustrated in FIG. 10(*b*), an insulating layer (first insulating layer) 11 is formed so as to cover the well 81 (silicon substrate 8). Via holes (contact holes) 11*a* and 11*b* are formed so as to pass through the insulating layer 11.

Inside the via holes 11*a* and 11*b*, a substance having a high heat diffusion rate and conductivity (for example, Cu, Al, W, or another metal or carbon nanotubes etc.) is filled to thereby form contact parts 62*a* and 62*b*.

Note that, while the explanation is omitted here, the via holes 11*a* and 11*b* are for example, formed by coating the insulating layer 11 with a resist, using a mask (reticle) for patterning, then etching etc.

Further, as illustrated in FIG. 10(*c*), the heat radiating part 5 is provided over the insulating layer 11 and contact parts 62*a* and 62*b*. Furthermore, on the heat radiating part 5, a Cu interconnect 3 is formed through an insulating layer (second insulating layer) 12. Note that, the insulating layer 10 is also formed near the heat radiating part 5 and Cu interconnect 3 (same layer).

Here, the heat radiating part 5 is formed from a substance 3 which includes a high heat dispersion rate and conductivity (for example, Cu, Al, W, or another metal or carbon nanotubes etc.) Further, the heat radiating part 5, for example, may be formed from the first layer Cu at the same time as various other interconnects.

Due to this, as explained above, the heat which is emitted from the poly-silicon resistor 1 is taken by the heat radiating part 5 and is dispersed through that heat radiating part 5 and contact parts 61a and 62a (61b and 62b) to the substrate 8 (well 81).

Note that, the contact locations of the well 81 with the contact parts 61a and 62a are made the silicide parts 83a and 83b and the active regions 82a and 82b, so it is possible to effectively disperse the heat from the contact parts 61a and 62a to the well 81 (substrate 8).

Further, by giving the well 81 a fixed potential (for example, ground potential) and making the contact parts 61a and 62a (61b and 62b) and the heat radiating part 5 conductive substances, it is possible to shield against noise (electrical field) from the poly-silicon resistor 1.

Furthermore, the above-mentioned insulating layers 10, 11, and 12, via holes 11a and 11b, contact parts 62a and 62b, and heat radiating part 5 (for example, heat radiating part made of Cu) may be formed as they are by the manufacturing process of various circuits in a semiconductor device.

In the above, the resistor 1 which generates the heat is not limited to a poly-silicon resistor and may be various resistance devices. Furthermore, it may also be a heat generating device other than a resistor as explained earlier.

Figure 11:
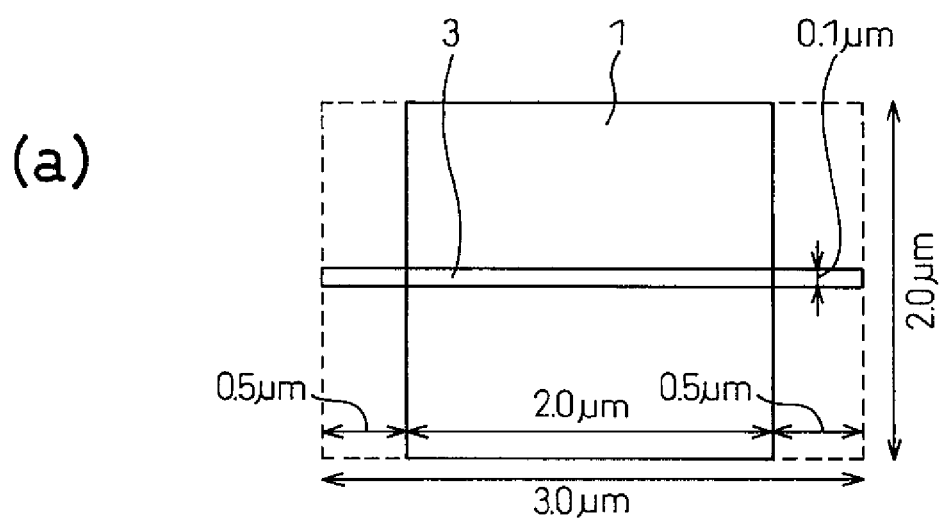
FIG. 11 gives a view which illustrates results of simulation of heat generation of a resistance device part in the semiconductor device which is illustrated in FIG. 1.
Figure 11:
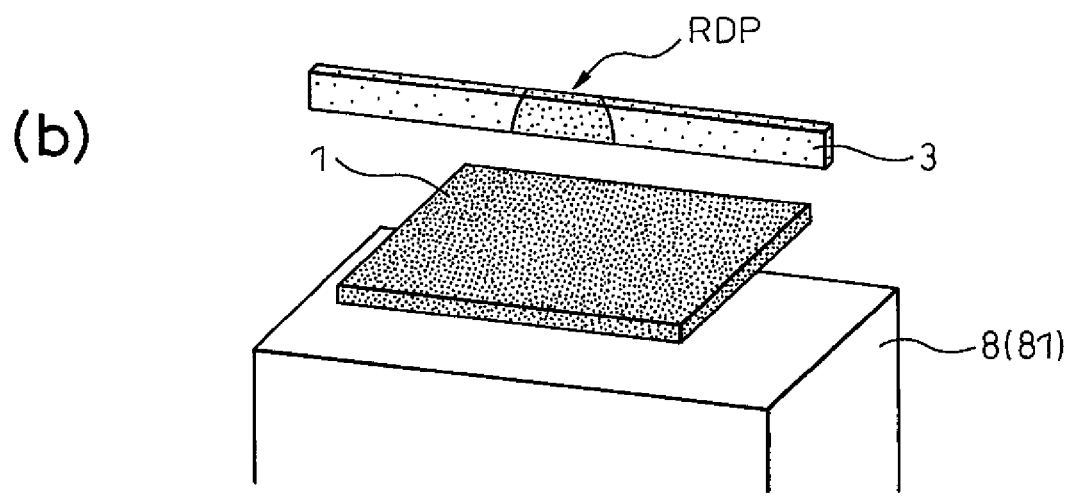
Figure 11:
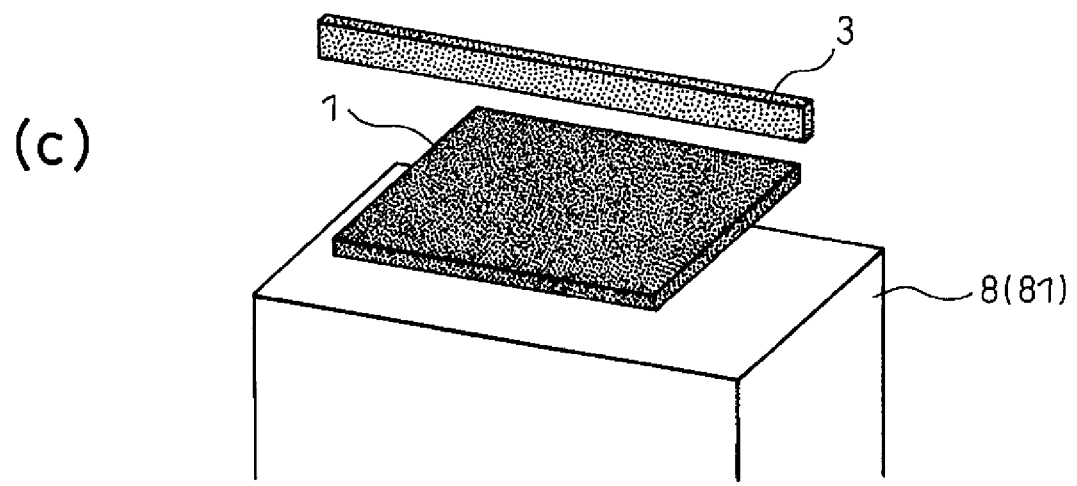

FIG. 11 gives a view which illustrates the results of simulation of heat generation of a resistance device part in the semiconductor device which is illustrated in FIG. 1. Here, FIG. 11($a$) illustrates the sizes of the different parts, FIG. 11($b$) illustrates the time when running a given current through the poly-silicon resistor, and FIG. 11($c$) illustrates the time when making the temperature of the Cu interconnect a given temperature.

As illustrated in FIG. 11($a$), in the heat generation simulation of the resistance device part of FIG. 1, the poly-silicon resistor 1 was made 2.0 μm×2.0 μm and a length 3.0 μm and width 0.1 μm Cu interconnect 3 was arranged on the poly-silicon resistor 1 at the center in the lateral direction. Note that, the ambient temperature was set to 125° C. for the simulation.

First, as illustrated in FIG. 11($b$), a current of I/Wd=0.20 mA/μm was run through the poly-silicon resistor 1, that is, a current of 0.40 mA was run through a width 2.0 μm poly-silicon resistor 1.

At this time, the temperature near the center of the Cu interconnect 3 (reliability danger part RDP) (maximum temperature) was 128.505° C. That is, it was confirmed that if running a 0.40 mA current through the poly-silicon resistor 1 at the resistance device part of FIG. 1, the maximum temperature of the Cu interconnect 3 rises exactly 3.505° C. from the ambient temperature of 125° C.

Next, as illustrated in FIG. 11($c$), to make the temperature of the Cu interconnect 3 rise from 125° C. to 130° C., a current of I/Wd=0.239 mA/μm was run through the poly-silicon resistor 1, that is, a current of 0.478 mA was run for a width 2.0 μm poly-silicon resistor 1.

Therefore, it was confirmed that to maintain the temperature of the Cu interconnect 3 at 130° C. or less in an ambient temperature of 125° C., it is only possible to run a current of 0.478 mA through the poly-silicon resistor 1.

Figure 12:
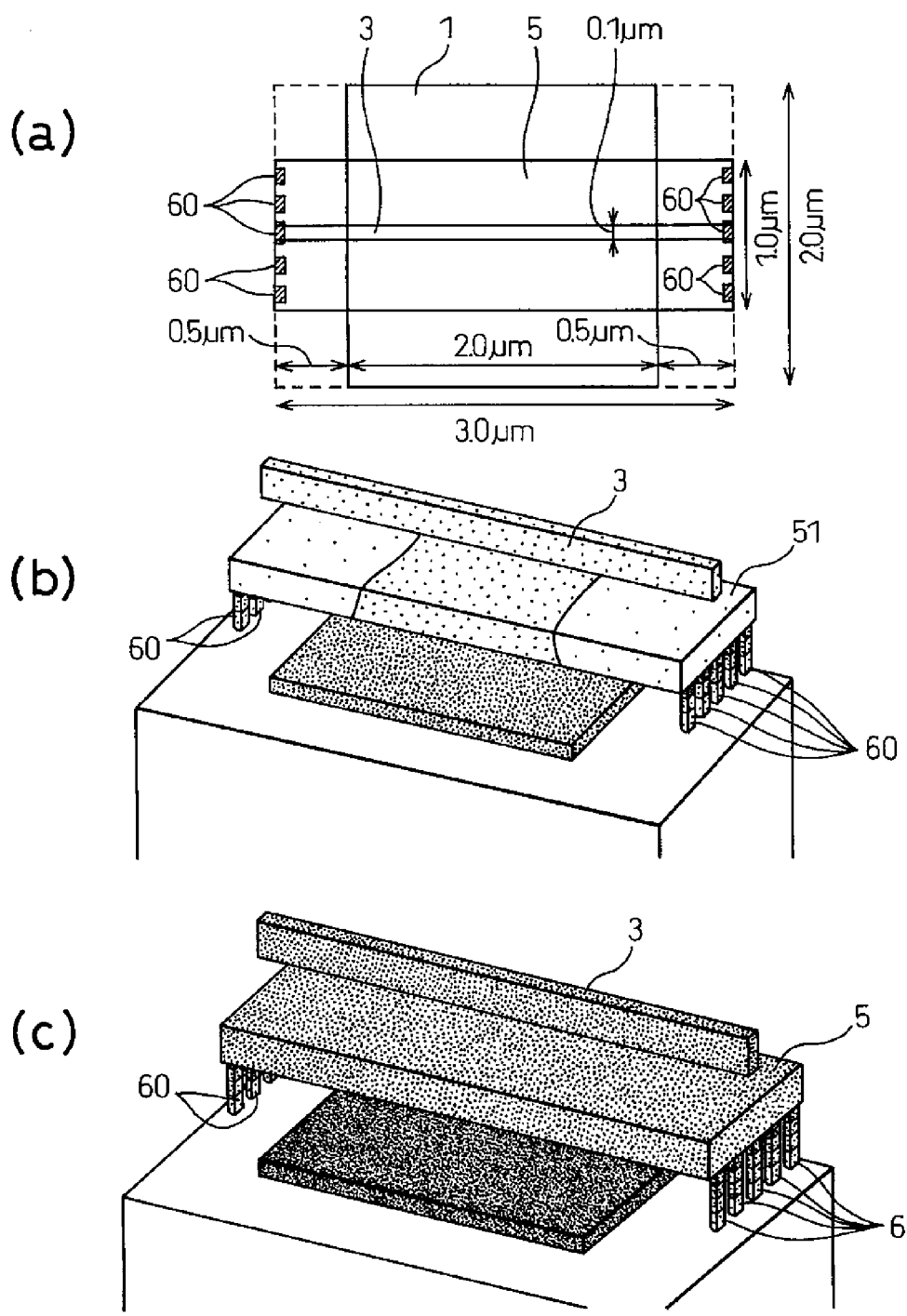
FIG. 12 gives a view which illustrates results of simulation of heat generation of a resistance device part in the semiconductor device of the first embodiment which is illustrated in FIG. 4.

FIG. 12 gives a view which illustrates results of simulation of heat generation of a resistance device part at a semiconductor device of the first embodiment which is illustrated in FIG. 4. Here, FIG. 12($a$) illustrates the sizes of the different parts, FIG. 12($b$) illustrates the time when running a given current through the poly-silicon resistor, and FIG. 12($c$) illustrates the time when making the temperature of the Cu interconnect a given temperature.

As illustrated in FIG. 12($a$), in the heat generation simulation of the resistance device part of FIG. 4, the poly-silicon resistor 1 was made 2.0 μm×2.0 μm and a length 3.0 μm and width 0.1 μm Cu interconnect 3 was arranged on the poly-silicon resistor 1 at the center in the lateral direction.

That is, a simulation was run for the poly-silicon resistor 1 and Cu interconnect 3 assuming similar conditions to FIG. 11. Note that, the ambient temperature was also, like in the simulation of FIG. 11, set to 125° C. for the simulation.

Further, as illustrated in FIG. 12($a$), in heat generation simulation of the resistance device part of FIG. 4, a heat radiating part 5 is provided between the poly-silicon resistor 1 and Cu interconnect 3 and the two ends of the heat radiating part 5 are coupled by five respective contact parts 60 to the substrate 8 well (81).

Here, the length of the heat radiating part 5 is made one similar to the Cu interconnect 3, that is, 3.0 μm, while the width of the heat radiating part 5 was made half of the width of 2.0 μm of the poly-silicon resistor 1, that is, 1.0 μm, for the simulation.

First, as illustrated in FIG. 12($b$), a current of I/Wd=0.20 mA/μm was run through the poly-silicon resistor 1, that is, a current of 0.40 mA was run through a 2.0 μm wide poly-silicon resistor 1.

At this time, the maximum temperature of the Cu interconnect 3 was 126.772° C. That is, it was confirmed that if running a current of 0.40 mA to the poly-silicon resistor 1 at the resistance device part of FIG. 1, the maximum temperature of the Cu interconnect 3 rises exactly 1.772° C. from the ambient temperature of 125° C.

Next, as illustrated in FIG. 12($c$), the temperature of the Cu interconnect 3 was made to rise from 125° C. to 130° C. by running a current of I/Wd=0.336 mA/μm through the poly-silicon resistor 1, that is, 0.6722 mA for a 2.0 μm width poly-silicon resistor 1.

Therefore, it was confirmed that to maintain the temperature of a Cu interconnect 3 at 130° C. or less at an ambient temperature of 125° C., it is only possible to run a current of 0.672 mA through the poly-silicon resistor 1.

From a comparison of FIG. 11($b$) and FIG. 12($b$), it is learned that the maximum temperature of a Cu interconnect 3 when running a 0.40 mA current through a poly-silicon resistor 1 rises to 3.505° C. in the example of FIG. 1, while only rises to 1.772° C. in the first embodiment of FIG. 4.

From a comparison of FIG. 11($c$) and FIG. 12($c$), it is learned that to make the temperature of a 125° C. Cu interconnect 3 130° C. or less, in the example of FIG. 1, it is only possible to run a 0.478 mA current, while in the first embodiment of FIG. 4, it is possible to run a current of 0.672 mA (about 1.4 times the same).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a semiconductor substrate;
   a heat generating device provided on the semiconductor substrate;
   a heat radiating part provided above the heat generating device; and
   an interconnect provided above the heat radiating part, wherein
   the heat radiating part is thermally coupled with the semiconductor substrate through at least one contact part, and
   an entire region overlapping with the interconnect in the heat generating device, in planar view, is entirely covered by the heat radiating part.

2. The semiconductor device as claimed in claim 1, wherein
   the heat radiating part is provided above the heat generating device through a first insulating layer, and
   the contact part is provided inside a via hole which is formed in the first insulating layer.

3. The semiconductor device as claimed in claim 1, wherein
   the semiconductor device further comprises a second insulating layer provided between the heat radiating part and the interconnect.

4. The semiconductor device as claimed claim 1, wherein
   the heat generating device is provided at the semiconductor substrate on a well which is electrically isolated by a first insulation region through a second insulation region, and
   the contact part thermally couples the heat radiating part and the well and disperses the heat of the heat radiating part through the well to the semiconductor substrate.

5. The semiconductor device as claimed in claim 4, wherein
   the heat radiating part and the contact part are conductive substances,
   the heat generating device is a resistance device, and
   the heat radiating part is made an equal potential with the well through the contact part.

6. The semiconductor device as claimed in claim 5, wherein
   the potential of the well is made a fixed potential so as to electrically shield against noise from the resistance device.

7. The semiconductor device as claimed in claim 1, wherein
   the contact part is provided at least at one end of the heat radiating part.

8. The semiconductor device as claimed in claim 1, wherein
   the heat radiating part is thermally coupled with the semiconductor substrate through a plurality of contact parts which are provided at two ends of the heat radiating part.

9. The semiconductor device as claimed in claim 1, wherein
   the heat radiating part is thermally coupled with the semiconductor substrate through a plurality of contact parts which are provided at an entire circumference of the heat radiating part.

* * * * *